US008590602B2

(12) United States Patent
Fernandez

(10) Patent No.: US 8,590,602 B2
(45) Date of Patent: Nov. 26, 2013

(54) HEAT EXCHANGER FOR OUTDOOR ENCLOSURES

(75) Inventor: Pedro A. Fernandez, Dallas, TX (US)

(73) Assignee: Asymblix, LLC, Richardson, TX (US)

( * ) Notice: Subject to any disclaimer, the term of this patent is extended or adjusted under 35 U.S.C. 154(b) by 903 days.

(21) Appl. No.: 12/137,368

(22) Filed: Jun. 11, 2008

(65) Prior Publication Data

US 2009/0052132 A1 Feb. 26, 2009

Related U.S. Application Data

(60) Provisional application No. 60/943,433, filed on Jun. 12, 2007.

(51) Int. Cl.
*F24H 3/06* (2006.01)
*F28D 15/00* (2006.01)

(52) U.S. Cl.
USPC ...................................... 165/122; 165/104.33

(58) Field of Classification Search
USPC ........ 165/80.3, 104.33, 104.34, 122, 111, 59, 165/66; 361/678, 679.47, 679, 48, 679.49, 361/679.5, 695, 696, 697; 454/184
See application file for complete search history.

(56) References Cited

U.S. PATENT DOCUMENTS

| | | | | |
|---|---|---|---|---|
| 2,932,953 A | * | 4/1960 | Becket et al. | 62/3.6 |
| 2,995,906 A | * | 8/1961 | Brandimarte | 62/427 |
| 3,943,728 A | * | 3/1976 | Maudlin | 62/507 |
| 4,386,651 A | * | 6/1983 | Reinhard | 165/104.33 |
| 4,449,579 A | * | 5/1984 | Miyazaki et al. | 165/104.33 |
| 4,461,344 A | * | 7/1984 | Allen et al. | 165/110 |
| 4,462,459 A | * | 7/1984 | Schmidlin | 165/54 |
| 4,513,809 A | * | 4/1985 | Schneider et al. | 165/54 |
| 4,874,040 A | | 10/1989 | Herrmann | |
| 4,971,137 A | * | 11/1990 | Thompson | 165/276 |
| 4,997,034 A | * | 3/1991 | Steffen et al. | 165/104.34 |
| 5,467,250 A | * | 11/1995 | Howard et al. | 361/696 |
| 5,529,120 A | | 6/1996 | Howard et al. | |

(Continued)

FOREIGN PATENT DOCUMENTS

JP 02029522 A * 1/1990

OTHER PUBLICATIONS

Greenheck Fan Corporation, "Multiple Fan Systems—Fans in Series and Parallel," Greenheck Production Application Guide, Fan Application FA/115-02, 2002, pp. 1-4, http://www.greenheck.com/technical/tech_detail.php?display=files/Product_guide/multfansystems, Greenheck Fan Corp.

(Continued)

*Primary Examiner* — Tho V Duong
(74) *Attorney, Agent, or Firm* — Pearl Cohen Zedek Latzer Baratz, LLP

(57) ABSTRACT

A heat exchanger having a wet side separate from a dry side for an equipment cabinet is provided. The heat exchanger includes a heat exchanger enclosure having a wet side fan and a dry side fan. The wet side fan draws air in from the external environment and routes the air through a heat exchanger core and out the heat exchanger enclosure. The dry side fan draws air in from within the equipment cabinet and routes the air through the heat exchanger core and out back into the equipment cabinet. The air from the outside acts to cool the heat exchanger core, which in turn acts to cool the air from the dry side as the air is routed through the heat exchanger core.

16 Claims, 9 Drawing Sheets

(56) References Cited

U.S. PATENT DOCUMENTS

| | | | |
|---|---|---|---|
| 5,603,376 | A | 2/1997 | Hendrix |
| 5,608,609 | A | 3/1997 | Morrell |
| 5,832,988 | A | 11/1998 | Mistry et al. |
| 6,149,254 | A * | 11/2000 | Bretschneider et al. ... 312/223.1 |
| 6,164,369 | A | 12/2000 | Stoller |
| 6,170,562 | B1 * | 1/2001 | Knoblauch ............. 165/104.33 |
| 6,351,381 | B1 * | 2/2002 | Bilski et al. ................... 361/695 |
| 6,494,252 | B1 * | 12/2002 | Takala et al. ............ 165/104.33 |
| 6,788,535 | B2 | 9/2004 | Dodgen et al. |
| 6,877,551 | B2 * | 4/2005 | Stoller ............................ 165/47 |
| 6,974,379 | B2 * | 12/2005 | Koessler ...................... 454/184 |
| 7,222,660 | B2 * | 5/2007 | Giacoma et al. ................ 165/47 |
| 2003/0231467 | A1 | 12/2003 | Replogle et al. |
| 2006/0032609 | A1 | 2/2006 | Fernandez et al. |
| 2006/0273081 | A1 | 12/2006 | Fernandez et al. |

OTHER PUBLICATIONS

TXP Corporation, "Roof Fan Kits: AFC-120/240 Cabinets," TXP Corporation Spec: 890-0002-100 Rev: A1, Mar. 29, 2007, 2 Pages, http://www.txpcorp.com/index.php?option=com_docman&task=doc_download&gid=4&Itemid=16%20-.

TXP Corporation, "Opac Cabinet Fan Kit," TXP Corporation Spec: 890-0024 Rev: A1, Apr. 11, 2008, 2 Pages, http://www.txpcorp.com/index.php?option=com_docman&task=doc_view&gid=6&tmpl=component&format=raw&Itemid=16.

TXP Corporation, "Ceiling Fan Kit: OPM 640 Cabinet," TXP Corporation Spec: 890-0001-100 Rev: A3, Mar. 14, 2007, 2 Pages, http://www.txpcorp.com/index.php?option=com_docman&task=doc_download&gid=7&Itemid=16-.

TXP Corporation, "1000 Watt Retrofit Heat Exchanger," TXP Corporation Spec: 890-0020-100 Rev: A5, Mar. 13, 2007, 2 Pages, http://www.txpcorp.com/index.php?option=com_docman&task=doc_download&gid=8&Itemid=16-.

* cited by examiner

HEAT EXCHANGER FOR OUTDOOR ENCLOSURES

This application claims the benefit of U.S. Provisional Application No. 60/943,433, filed on Jun. 12, 2007, entitled "Heat Exchanger for Outdoor Enclosures", which application is hereby incorporated herein by reference.

TECHNICAL FIELD

The present invention relates generally to thermal management and, more particularly, to a heat exchanger for cooling electronic equipment.

BACKGROUND

Electronic equipment frequently generates heat during operation and requires cooling in order to prevent the electronic equipment from over-heating and possibly failing. One common type of cooling involves the use of fans arranged so as to force the circulation of air from the outside around the electronic equipment. In this process, hot air from the inside is replaced with cooler air from the outside. The cooler air from the outside is circulated around the electronic equipment, thereby cooling the electronic equipment.

One problem with this approach is that the outside air may be contaminated with moisture and/or dust. The moisture and/or dust in the outside air may adversely affect the operation of the electronic equipment. This problem may be particularly troublesome in outdoor installations wherein the equipment cabinet is exposed to all elements of the weather.

Another approach that has been developed to help account for the elements of the weather is to use a cooling system having a dry side and a wet side. In this approach, air interior to the equipment cabinet is circulated over a series of cooling fins in one direction. Air exterior to the equipment cabinet is circulated over the cooling fins in another direction. The exterior air acts to cool the cooling fins. The lower temperature of the cooling fins then acts to cool the interior air that is flowing over the cooling fins. In this manner, the air from the wet side is separated from the air in the dry side, and the electronic equipment is cooled by lowering the temperature of the interior air, rather than bringing in cooler air from the outside.

This approach, however, also has problems. For example, the arrangements often involve two fans on opposite ends of the heat exchanger enclosure. One fan is used to circulate the air on the dry side, and one fan is used to circulate the air on the wet side. If the fan on the dry side is located on the bottom and the fan on the wet side is located on the top, then the fan on the dry side located at the bottom is circulating the cooler air in the bottom of the equipment enclosure rather than the hot air in the top of the equipment enclosure. If the fan on the wet side is located on the bottom and the fan on the dry side is located on the top, then the fan on the wet side often circulates dust from the ground into the heat exchanger, and the fan may be covered with vegetation around the equipment cabinet.

Accordingly, there is a need for a heat exchanger to effectively and efficiently cool electronic equipment.

SUMMARY OF THE INVENTION

These and other problems are generally reduced, solved or circumvented, and technical advantages are generally achieved, by embodiments of the present invention, which provides a heat exchanger.

In an embodiment, a heat exchanger is provided. The heat exchanger includes a heat exchanger core, a first fan, and a second fan. The first fan directs air from the outside through the heat exchanger core, and the second fan directs air from within an equipment cabinet through the heat exchanger core. The first fan and the second fan rotate about a common axis. The intake ports for the first fan and the second fan are preferably positioned in an upper portion of the heat exchanger.

In another embodiment, a heat exchanger having a heat exchanger enclosure with a first fan, a second fan, and a heat exchanger core mounted therein is provided. The first fan and the second fan are mounted in a top region of the heat exchanger enclosure. A first air flow is defined from the first fan through the heat exchanger core and out the heat exchanger enclosure through a first output vent, and a second air flow path is defined from the second fan through the heat exchanger core and out the heat exchanger enclosure through a second output vent. The first air flow path is isolated from the second air flow path.

In yet another embodiment, a method of providing a heat exchanger is provided. The method comprises providing a heat exchanger enclosure, wherein the heat exchanger enclosure has a first air intake and a second air intake on an upper portion, and a first air output and a second air output along a bottom portion of the heat exchanger enclosure. A first fan, a second fan, and a heat exchanger core is also provided attached to the heat exchanger enclosure. The first fan is provided such that the first fan draws air through the first air intake and out the first air output through the heat exchanger core, and the second fan is provided such that the second fan draws air through the second air intake and out the second air output through the heat exchanger core. The first fan and the second fan are located in the upper portion of the heat exchanger enclosure.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The following description describes embodiments of a heat exchanger to provide additional cooling capacity, and may be particularly well suited for outdoor equipment enclosures (also referred to as equipment cabinets). Generally, the equipment enclosures typically contain some form of electronic equipment and are typically sealed to prevent water and dust intrusion. The heat exchangers in accordance with embodiments of the present invention utilize two independent air-flow loops, one air-flow loop is for the 'wet side' that circulates air from the outside and the other air-flow loop is for the 'dry side' that circulates air inside the enclosure. The heat exchanger can be installed on any surface of the enclosure, but is preferably installed on a flat surface such as the door. The heat exchanger can be installed in the factory during the manufacture of the equipment enclosure, or in the field after the equipment enclosure is deployed.

Figure 1:
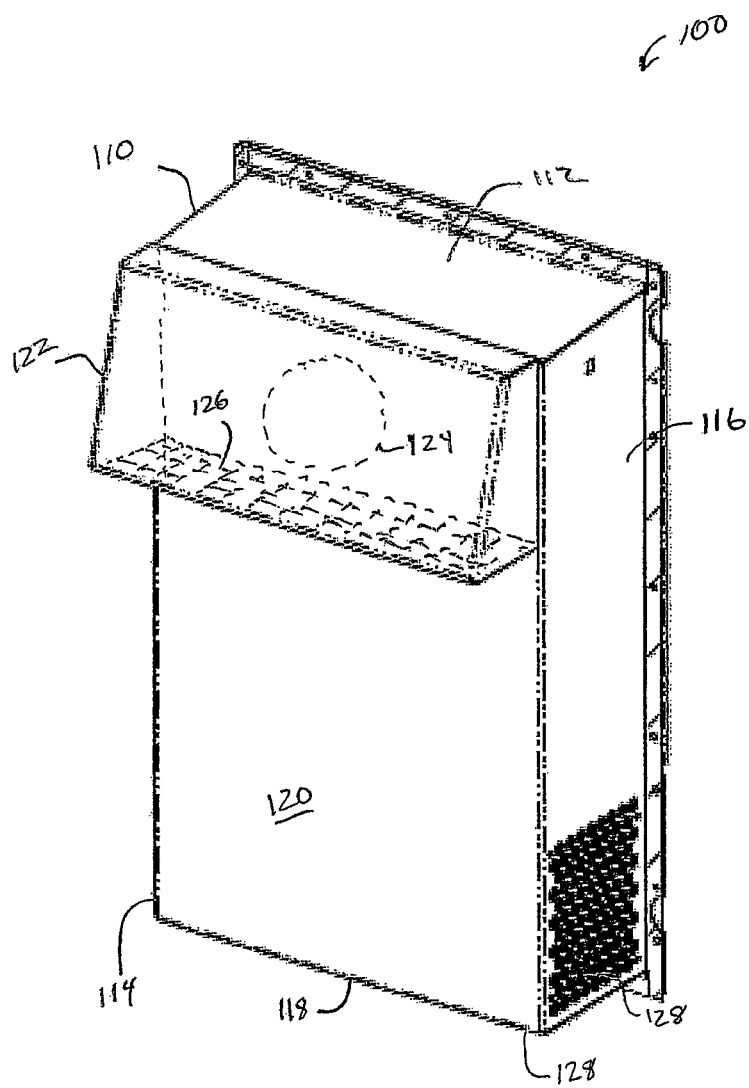
FIG. 1 is a perspective view of an exterior of a heat exchanger in accordance with an embodiment of the present invention.

Referring first to FIG. 1, there is shown a perspective view of an exterior of the heat exchanger 100 in accordance with an embodiment of the present invention. The heat exchanger 100 includes a heat exchanger enclosure 110 having rectangular shape. The heat exchanger enclosure 110 comprises a top panel 112, side panels 114 and 116, and a bottom panel 118 with an exterior cover 120 extending over the top panel 112, the side panels 114 and 116, and the bottom panel 118.

The heat exchanger 100 further includes a vent hood 122 attached along the top of the exterior cover 120. As will be discussed in greater detail below, the vent hood 122 covers an exterior fan intake port 124 (shown by dotted lines on FIG. 1) to prevent rain, hail, snow, and the like from directly entering the exterior fan intake port 124. A first protective grill 126 (shown by dotted line in FIG. 1) may be placed along the bottom of the vent hood to further protect the exterior fan intake port 124 from interference with, for example, vegetation, insects (e.g., wasps), and the like.

Also shown in FIG. 1 is an exterior fan output port 128. Preferably, the exterior fan output port 128 comprises a vented area in a lower corner of the heat exchanger enclosure 110, including a lower portion of the side panel 116 and a portion of adjoining bottom panel 118 of the heat exchanger enclosure 110.

In this embodiment, air from the outside is drawn into the heat exchanger 100 through the exterior fan intake port 124, circulated through the heat exchanger 100 to reduce the internal air temperature, and vented to the outside through the exterior fan output port 128.

Figure 2:
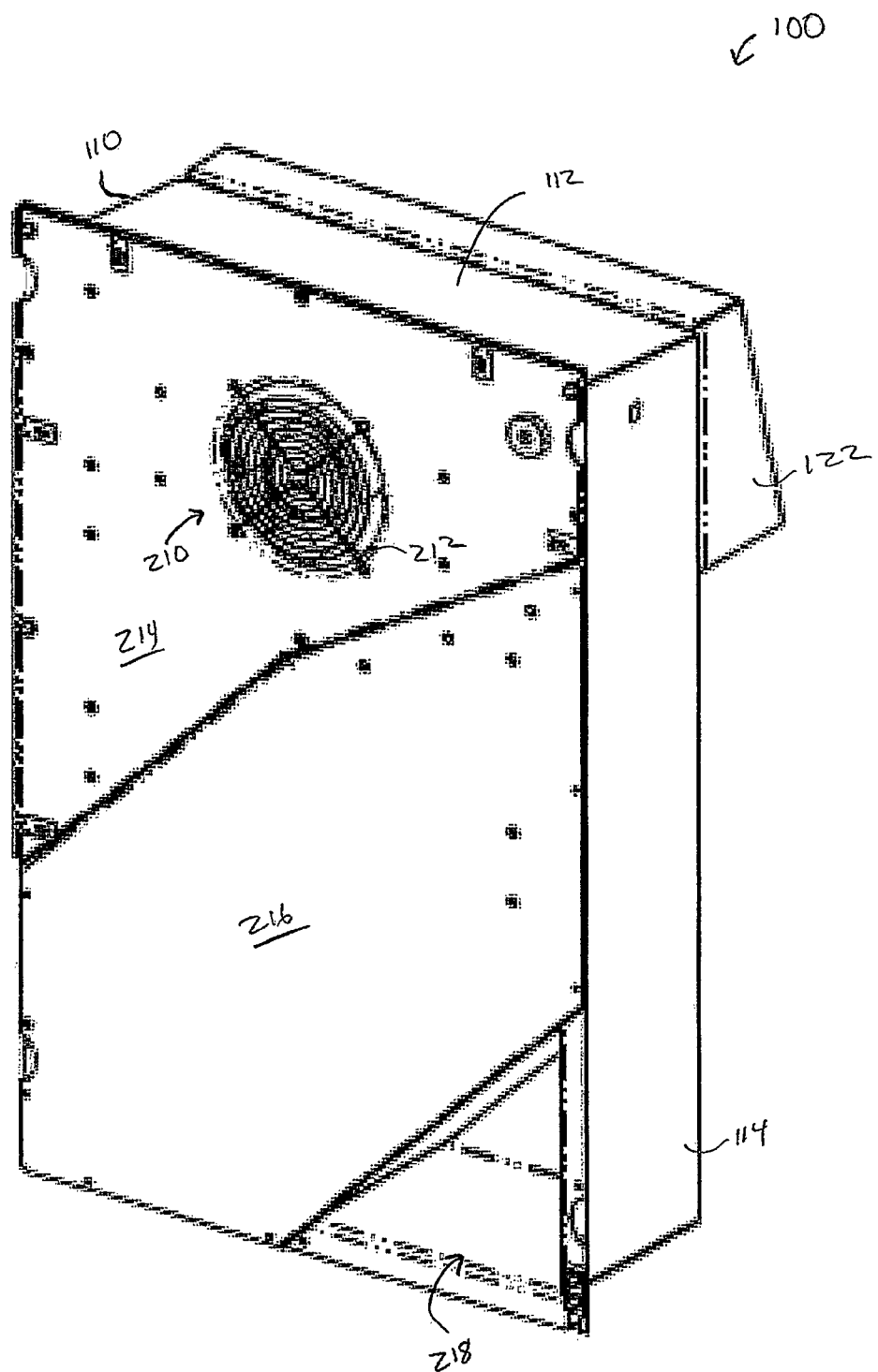
FIG. 2 is a perspective view of an interior of a heat exchanger in accordance with an embodiment of the present invention.

FIG. 2 is a perspective view of an interior side of the heat exchanger 100 in accordance with an embodiment of the present invention. The interior side of the heat exchanger 100 includes an interior air intake port 210 covered with a second protective grill 212. In the embodiment illustrated in FIG. 2, the heat exchanger 100 further includes a first panel 214 and a second panel 216. The use of two panels is preferred for easier maintenance. As will be discussed in greater detail below, a dry side fan (not shown in FIG. 2) is attached directly to the underside of the first panel 214, and accordingly, the dry side fan may be serviced by removing the first panel 214. The second panel 216 may remain during servicing, reducing the risk of contamination and/or damaging other elements of the heat exchanger 100. A wet side fan (not shown in FIG. 2) may also be serviced by removing the first panel 214 and leaving the second panel 216 in place.

In operation, hot air from the equipment cabinet is drawn into the heat exchanger 100 via the interior air intake port 210. The hot air is cooled, and the cooled air is expelled back into the equipment cabinet via an interior output port 218.

Figure 3:
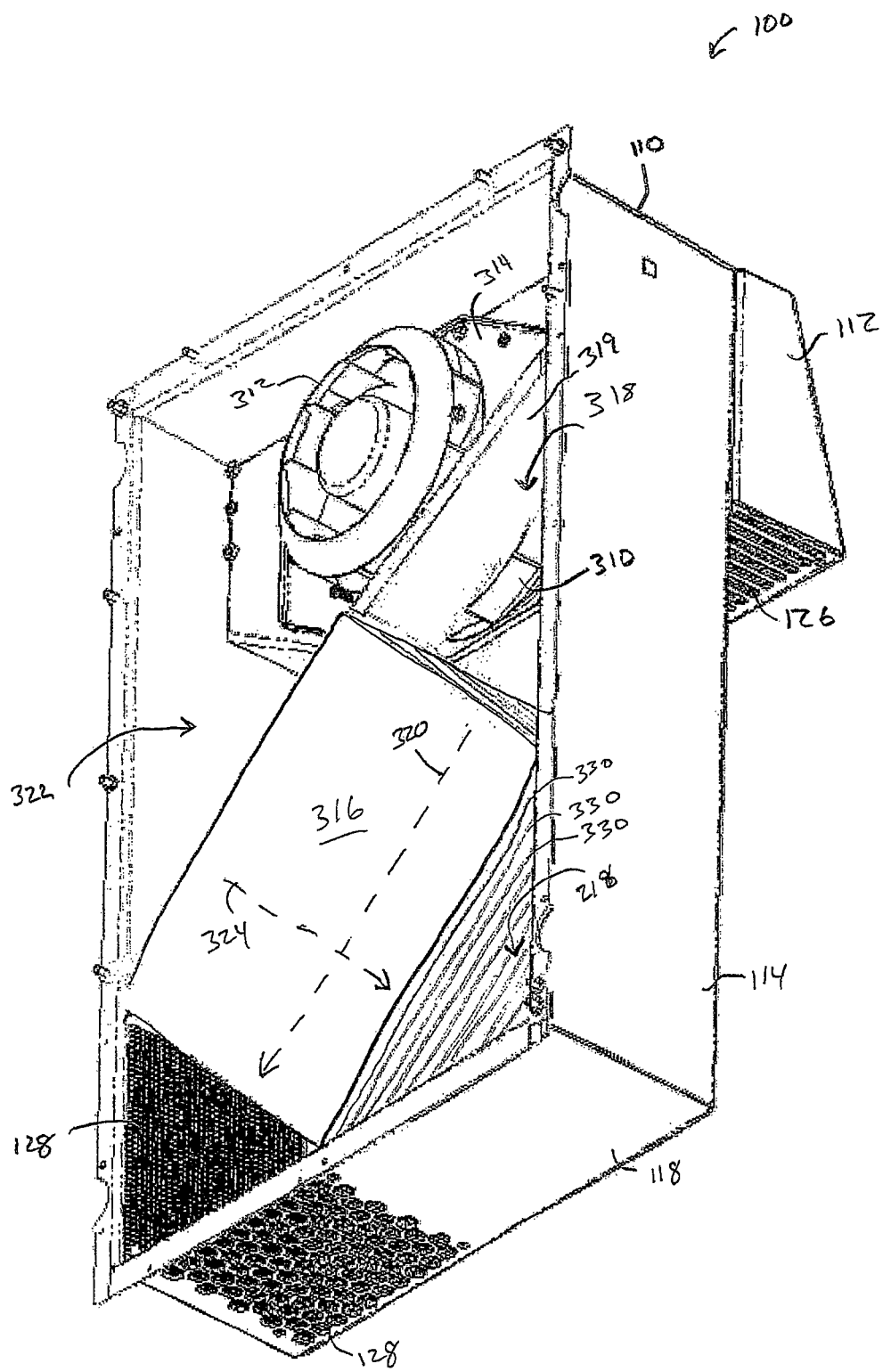
FIG. 3 is a perspective view of a heat exchanger with the interior covers removed in accordance with an embodiment of the present invention.
Figure 4:
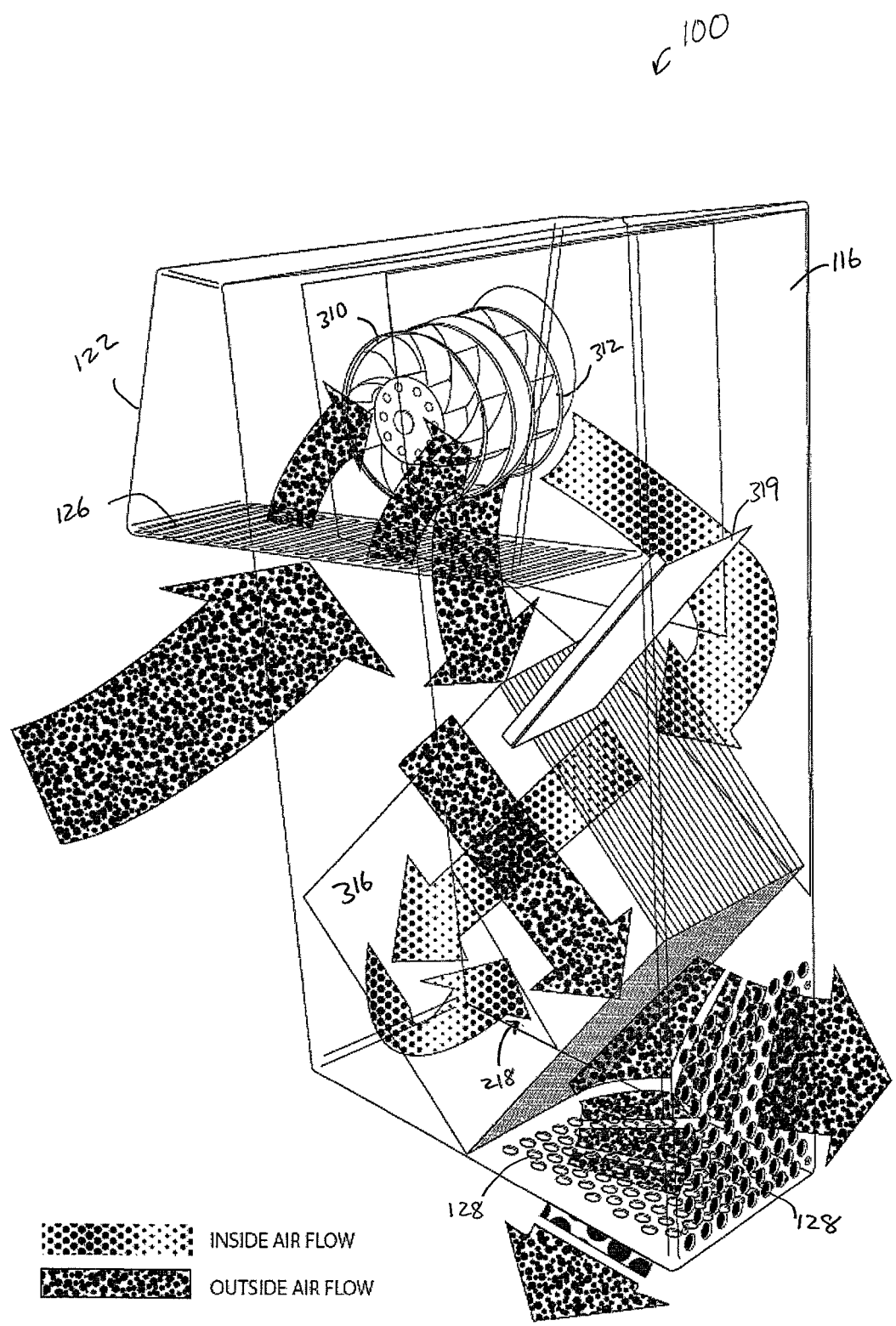
FIG. 4 is a perspective view of a heat exchanger illustrating air flow in accordance with an embodiment of the present invention.

FIG. 3 is a perspective view of the heat exchanger 100 from the interior side with the first panel 214 and the second panel 216 (see FIG. 2) removed to better illustrate the structure of the heat exchanger 100 in accordance with an embodiment of the present invention, and FIG. 4 further illustrates the air flow through the heat exchanger 100. In this embodiment, the heat exchanger 100 includes a wet fan 310 and a dry fan 312. The wet fan 310 and the dry fan 312 are separated from each other by a fan plate 314 and, preferably, rotate about a common axis. The wet fan 310 and the dry fan 312 may include separate motors for each of the wet fan 310 and the dry fan 312, or a single motor may be used with a common shaft. In this latter embodiment, the wet fan 310 and the dry fan 312 comprises different fan blades attached to a common shaft rotated by a common motor. This has the additional advantage that the electronic motor may be kept within the sealed portion away from the elements of the weather.

The wet fan 310 is exposed to a heat exchanger core 316 via a first cavity 318. In this manner, air drawn from the outside into the heat exchanger 100 via the wet fan 310 is directed through the heat exchanger core 316 as indicated by the dotted flow line 320. The outside air exits the heat exchanger core 316 and is vented to the outside via the exterior fan output port 128.

The dry fan 312 is also exposed to the heat exchanger core 316 via a second cavity 322. The air drawn from the inside of the equipment cabinet (not shown) is directed through the heat exchanger core 316 as indicated by the dotted flow line 324 to the interior output port 218. It should be noted that the air dam 319 separates the dry fan 312 from the first cavity 318.

In a preferred embodiment, the heat exchanger core 316 comprises a fin-type structure arranged to allow orthogonal air flows as indicated by the dotted flow lines 320 and 324 as is known in the art. Thermally conductive fins or plates 330 are arranged horizontally such that the outside air flowing in the direction of the dotted flow line 320 is completely separated from the inside air flowing in the direction of the dotted flow line 324. In operation, the flow of outside air over the thermally conductive fins is used to reduce the temperature of the thermally conductive fins. As the hot inside air flows over thermally conductive fins, causing the temperature of the inside air to be reduced. Or, in other words, the heat from the hot inside air is transferred from the air to the thermally conductive fins, and the heat from the thermally conductive fins is transferred to the outside air flowing over the thermally conductive fins and expelled out the exterior fan output port 128, thereby reducing the heat within the equipment cabinet.

In this manner, the electronic equipment within the enclosure is protected from dust and other contaminants in the outside air, while allowing the outside air to reduce the temperature of the inside air.

Figure 5:
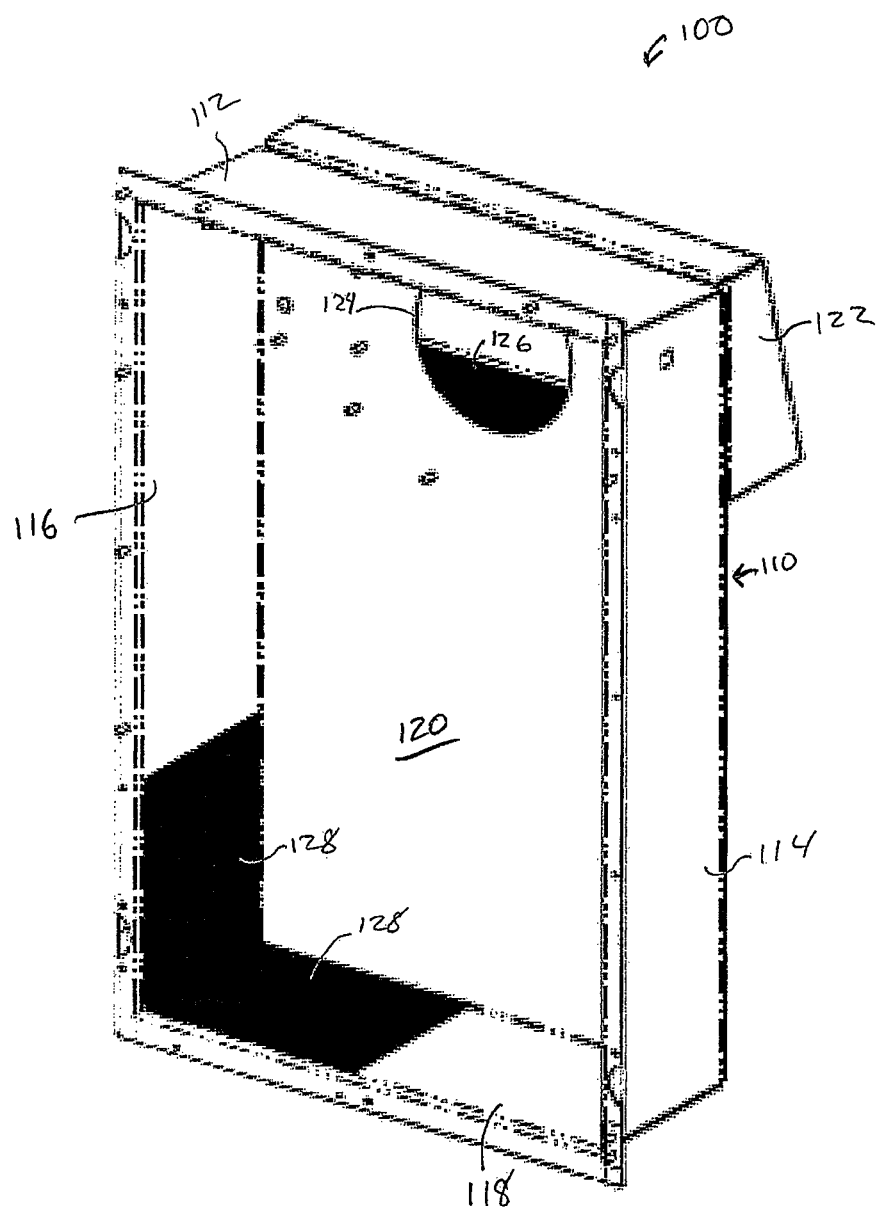
FIGS. 5-9 are plan views illustrating the assembly of a heat exchanger in accordance with an embodiment of the present invention.

FIGS. 5-9 further illustrate various stages of the assembly of the heat exchanger 100 to better illustrate the structure in accordance with an embodiment of the present invention. Referring first to FIG. 5, there is shown the heat exchanger enclosure 110 prior to attaching other components. As shown the heat exchanger enclosure 110 includes the top panel 112, the side panels 114 and 116, and the bottom panel 118. The exterior is covered with the exterior cover 120. The exterior fan intake port 124 provides an opening for the outside air to enter the heat exchanger 100. The exterior fan output port 128 is also shown as vents in the corner adjoining the bottom panel 118 and the side panel 116. The vent hood 122 with a first protective grill 126 is attached to the exterior cover 120.

Figure 6:
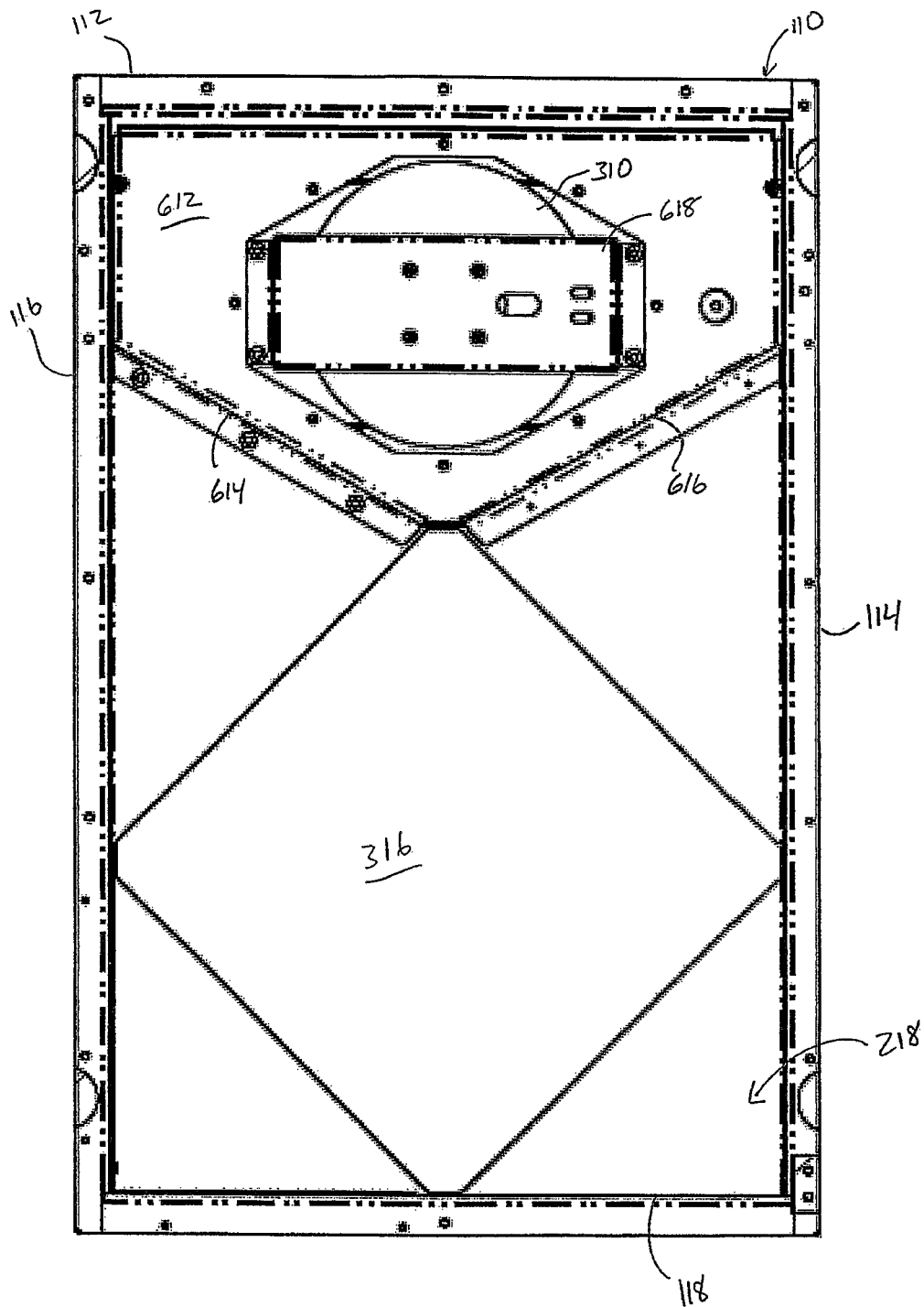

FIG. 6 illustrates the attachment of the wet fan 310, a mounting frame 612, and the heat exchanger core 316. The wet fan 310 may be attached directly to the inside surface of the exterior cover 120 via the use of a wet fan mounting bracket 618. The mounting frame 612 has a first portion 614 extending down to the inside of the exterior cover 120, thereby helping to suspend the mounting frame 612 above the inside of the exterior cover 120. Furthermore, the mounting frame 612 includes a second portion 616 extending outward, which acts as the air dam 319 illustrated in FIG. 3.

Figure 7:
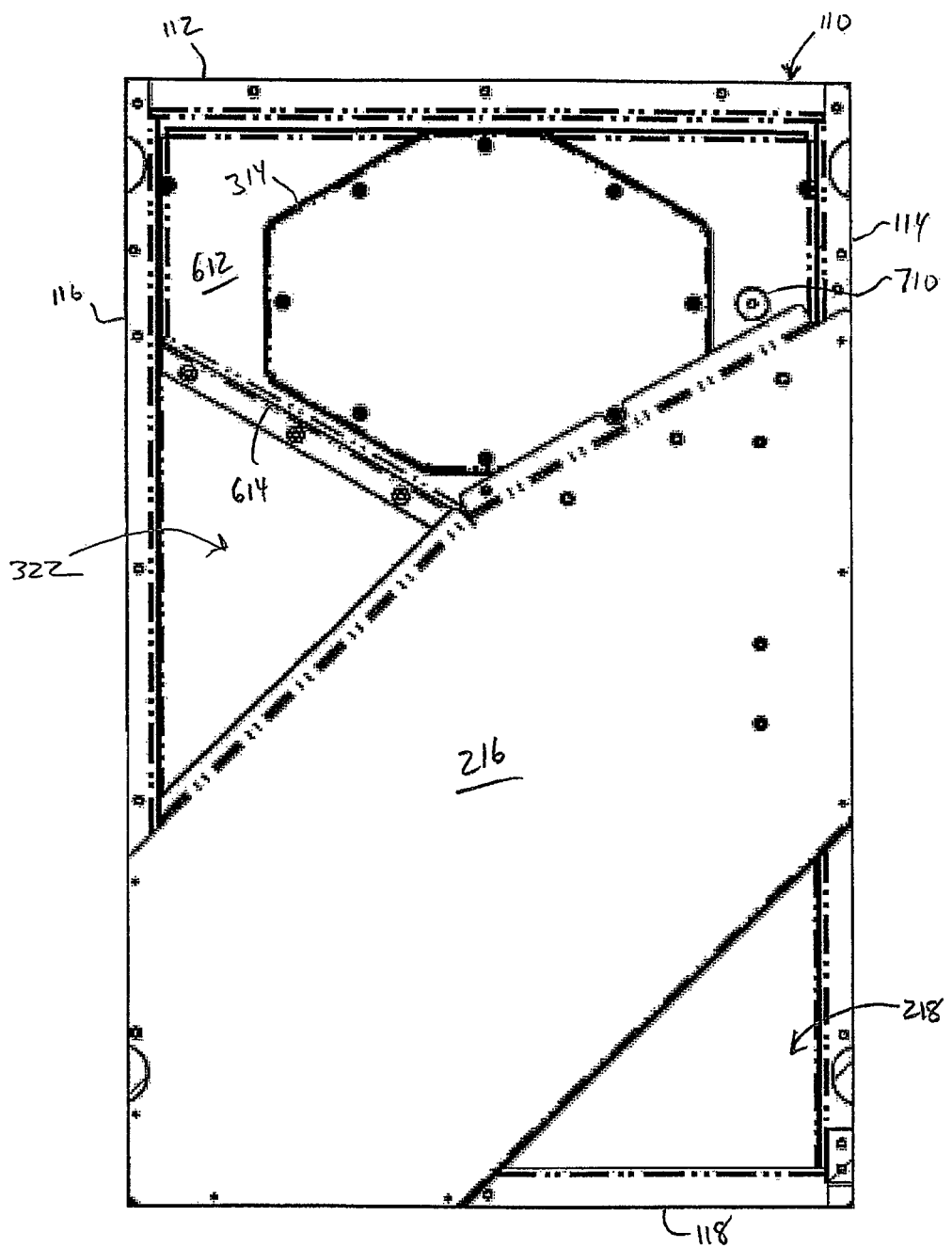

In FIG. 7, the wet fan cover plate 314 is attached to the mounting frame 612 and the second plate 216 is attached. With the installation of the wet fan cover plate 314 and the second plate 216, the air flow of the cooling outside air is sealed from the air flow of the inside air. In particular, the wet fan cover plate 314 separates the wet fan from the dry fan 312, and the second plate 216 seals in the heat exchanger core 316 and the first cavity 318 (see FIG. 3). The wet fan cover plate 314 is preferably removable to provide a service access to the wet fan 310. Also, cabling for the wet fan 310 is routed from the wet side to the dry side through a sealed grommet 710.

Figure 8:
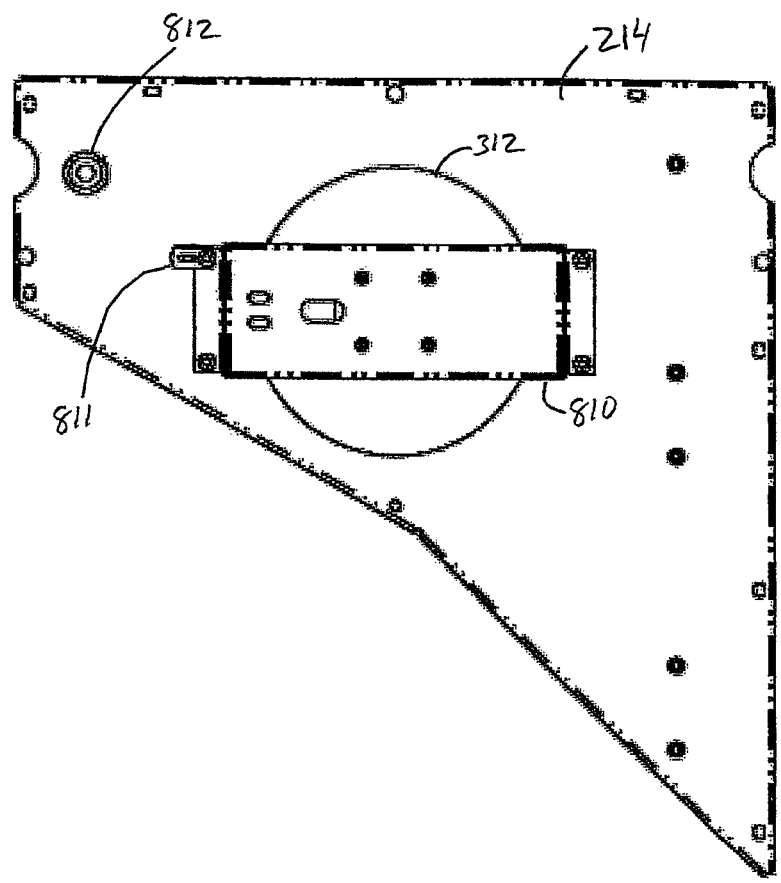
Figure 9:
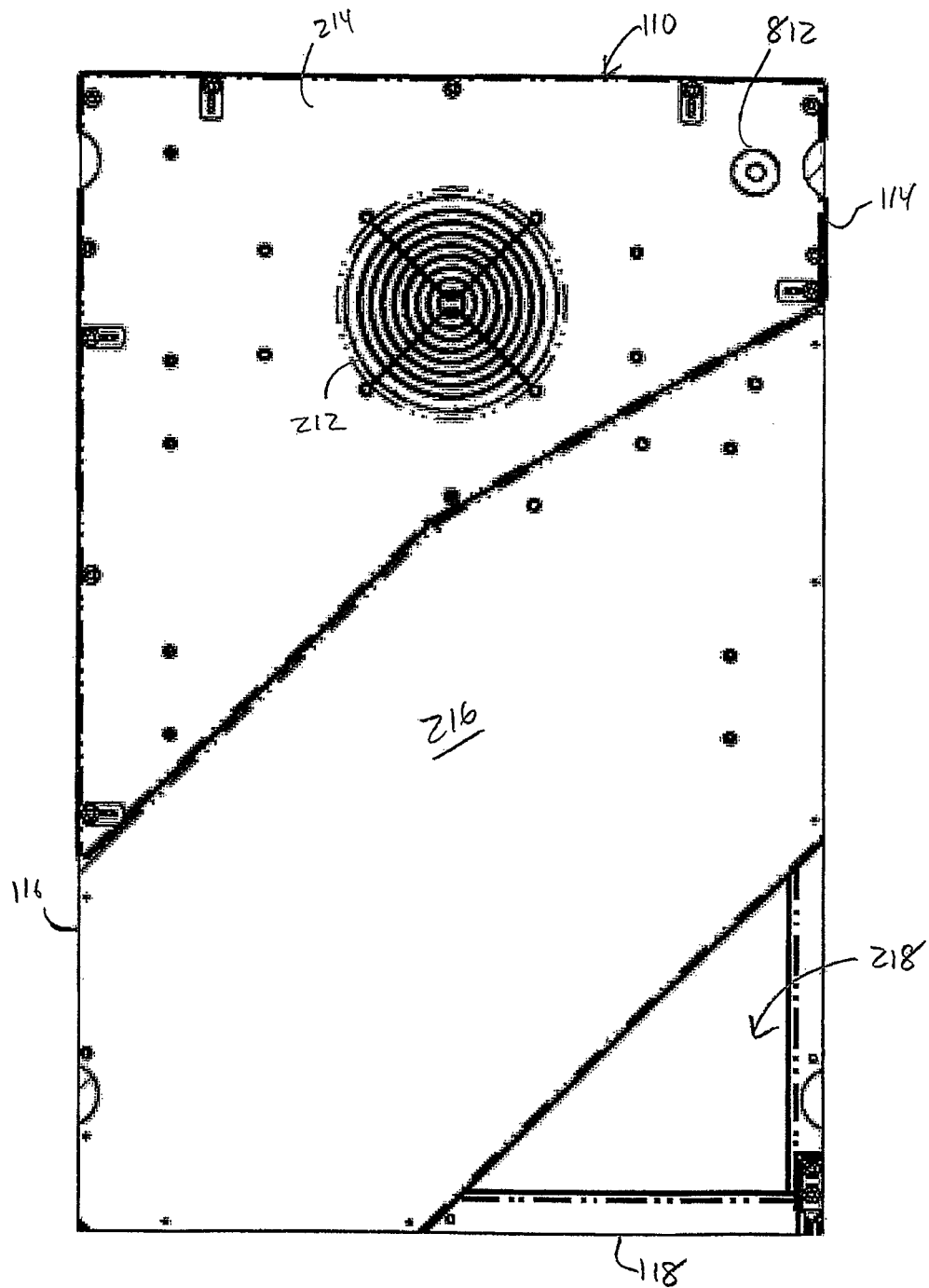

FIG. 8 illustrates the attachment of the dry fan 312 to the underside of the first panel 214 using a dry fan mounting bracket 810. Once assembled, the first panel 214 with the dry fan 312 attached is inverted and attached to the heat exchanger enclosure 110 as illustrated in FIG. 9. The second protective grill 212 may also be attached. Reference numeral 811 denotes a cable tie point used to route and strain relieve the dry side fan cable. Wet side and dry side fan cabling is routed through a grommet 812.

A cable tie point 811 may be provided to route and strain relieve cabling from the dry fan 312. A grommet 812 may be used to route cabling from the wet fan 310 and the dry fan 312 to the exterior of the heat exchanger 100.

One of ordinary skill in the art will appreciate that the internal arrangement and external mounting of a heat exchanger in accordance with embodiments of the present invention solve unique problems. Internally, the heat exchanger uses a back-to-back fan arrangement, thereby allowing a shorter enclosure in the vertical axis as compared to other heat exchangers of similar capacity. The short length also allows it to be installed on shorter enclosures.

The arrangement of the fans also allows the two fans with their two motors to be replaced with a single unit that has the two fans mounted on a common shaft using a single motor. The benefits of this are reduced cost and improved reliability, since this removes all electronics from the wet side.

Externally, the fan arrangement allows the fan inlets for both the inside loop and outside loop to be at the top of the heat exchanger enclosure. Inside the enclosure, this provides the best circulation for the cool air. Outside the enclosure, this positions the inlet high above the ground, reducing dust entrapment. Also, because its active internal components are accessible and replaceable from the inside of the enclosure, the heat exchanger can be permanently attached to the enclosure, reducing problems with external gaskets and vandalism.

In an embodiment, two or more of the heat exchangers discussed above may be installed on a single cabinet to provide a greater amount of cooling. For example, two heat exchangers similar to that discussed above have been installed on a Calix ODC-80 cabinet. Any other suitable cabinet could alternatively be used. Telecommunications equipment is installed with the cabinet. In the example of a Calix ODC-80 broadband enclosure, any combination of four Calix C7 or F5 platforms can be housed to provide all the powering, protection, and cable management to serve up to 1,920 copper or direct fiber subscribers, or up to 5,120 PON subscribers. As noted above, the Calix enclosure provides just one example of a cabinet that can utilize the heat exchanger of the invention. Any other enclosure could also utilize the invention. The heat exchanger can be provided as a retrofit solution for an existing cabinet. A heat exchanger retrofit kit can replace or add a heat exchanger to an existing outdoor enclosure.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A heat exchanger for attachment to an equipment cabinet, said heat exchanger comprising:
    a heat exchanger enclosure containing a heat exchanger core comprising a plurality of thermally conductive plates situated between opposing front and back sides of the heat exchanger enclosure, the heat exchanger enclosure further comprising a wet side input port through said front side and a dry side input port through said back side, the wet side input port and the dry side input port being located on an upper region of the heat exchanger enclosure;
    a first fan directing air from outside the equipment cabinet through the heat exchanger core and back to the outside of the equipment cabinet, air from the first fan being directed to a plurality of first air flow paths, each of the first air flow paths being between major surfaces of adjacent ones of the plurality of thermally conductive plates; and
    a second fan directing air from inside the equipment cabinet through the heat exchanger core and back to the inside of the equipment cabinet, the first fan and the second fan being arranged back-to-back with each other, air from the second fan being directed to a plurality of second air flow paths, each of the second air flow paths being between major surfaces of adjacent ones of the plurality of thermally conductive plates;
    wherein said back side is adapted to be attached to an external wall of the equipment cabinet, such that air from inside the equipment cabinet is drawn from the equipment cabinet by said second fan through an opening in the equipment cabinet external wall and into said heat exchanger enclosure through said back side, without inflow of air from outside the equipment cabinet.

2. The heat exchanger of claim 1, wherein the first fan and the second fan have a common shaft.

3. The heat exchanger of claim 1, further comprising a vent hood covering the wet side input port.

4. The heat exchanger of claim 1, wherein air flow from the first fan is completely separated from air flow from the second fan.

5. A heat exchanger for attachment to an equipment cabinet, said heat exchanger comprising:
- a heat exchanger enclosure having opposing front and back sides, a top region and a bottom region;
- a first fan mounted in the top region of the heat exchanger enclosure;
- a second fan mounted in the top region of the heat exchanger enclosure and being arranged back-to-back with said first fan;
- a heat exchanger core mounted in the heat exchanger enclosure between said front and back sides;
- a first air flow path defined from a first input vent to the first fan through the heat exchanger core and out the heat exchanger enclosure through a first output vent, the first input vent and the first output vent being on a same front side of the heat exchanger enclosure; and
- a second air flow path defined from the second fan through the heat exchanger core and out the heat exchanger enclosure through a second output vent, the first air flow path being isolated from the second air flow path, wherein the first air flow path crosses the second air flow path;
- wherein, when said heat exchanger enclosure is attached to the equipment cabinet, air from inside the equipment cabinet is drawn from the equipment cabinet by said second fan through an external wall of the equipment cabinet and into the heat exchanger enclosure through said back side thereof, without inflow of air from outside the equipment cabinet.

6. The heat exchanger of claim 5, wherein the first fan and the second fan rotate about a common axis.

7. The heat exchanger of claim 5, wherein the first fan and the second fan rotate about a common shaft.

8. The heat exchanger of claim 5, wherein the first input vent is located on an upper region of the heat exchanger enclosure.

9. The heat exchanger of claim 5, further comprising a vent hood covering an input opening for the first fan.

10. The heat exchanger of claim 5, wherein the heat exchanger core comprises a plurality of thermally conductive plates.

11. A method of attaching a heat exchanger to an equipment cabinet for cooling the inside thereof, the method comprising:
- providing a heat exchanger enclosure, the heat exchanger enclosure having opposing front and back sides, and having a first air intake and a second air intake on an upper portion of the heat exchanger enclosure, the first air intake being on an opposing side of the heat exchanger enclosure from the second air intake, the heat exchanger enclosure having a first air output and a second air output along a bottom portion of the heat exchanger enclosure, the first air intake and the first air output being positioned on the same side;
- providing a heat exchanger core attached to the heat exchanger enclosure;
- providing a first fan attached to the heat exchanger enclosure such that the first fan draws air through the first air intake and out the first air output through the heat exchanger core; and
- providing a second fan attached to the heat exchanger enclosure such that the second fan draws air through the second air intake and out the second air output through the heat exchanger core, the first fan and the second fan being located in the upper portion of the heat exchanger enclosure and being arranged back-to-back with each other; and
- attaching said heat exchanger enclosure to the equipment cabinet such that the second air intake is coupled to receive air directly from an opening in the equipment cabinet, whereby air from inside the equipment cabinet is drawn from the equipment cabinet by said second fan through said opening in the equipment cabinet and into said heat exchanger enclosure through said second air intake and is returned to the equipment cabinet by said second air output, without inflow of air from outside the equipment cabinet.

12. The method of claim 11, wherein the first fan and the second fan rotate about a common axis.

13. The method of claim 11, wherein the first fan and the second fan rotate about a common shaft.

14. The method of claim 11, further comprising providing a vent hood covering the first air intake.

15. The method of claim 11, wherein the heat exchanger core comprises a plurality of thermally conductive plates.

16. The method of claim 11, wherein the air from inside the equipment cabinet, once cooled by said heat exchanger core, is returned to the equipment cabinet by said second air output.

* * * * *